US012733097B2

(12) United States Patent
Okano et al.

(10) Patent No.: US 12,733,097 B2
(45) Date of Patent: Sep. 8, 2026

(54) DISK DEVICE

(71) Applicants: Kabushiki Kaisha Toshiba, Tokyo (JP); Toshiba Electronic Devices & Storage Corporation, Tokyo (JP)

(72) Inventors: Taichi Okano, Yokohama Kanagawa (JP); Nobuhiro Yamamoto, Yokohama Kanagawa (JP); Hayato Yamaguchi, Yokohama Kanagawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 408 days.

(21) Appl. No.: 18/243,077

(22) Filed: Sep. 6, 2023

(65) Prior Publication Data

US 2024/0196534 A1 Jun. 13, 2024

(30) Foreign Application Priority Data

Dec. 8, 2022 (JP) ................................ 2022-196595

(51) Int. Cl.
*H05K 1/14* (2006.01)
*H05K 1/02* (2006.01)
(Continued)

(52) U.S. Cl.
CPC ............... *H05K 1/14* (2013.01); *H05K 1/028* (2013.01); *H05K 1/0298* (2013.01); *H05K 1/189* (2013.01); *G11B 5/4806* (2013.01); *G11B 5/4846* (2013.01)

(58) Field of Classification Search
CPC ........ H05K 1/14; H05K 1/028; H05K 1/0298; H05K 2201/10159; H05K 3/363;
(Continued)

(56) References Cited

U.S. PATENT DOCUMENTS 6,396,665 B1 * 5/2002 Asano .................... H05K 3/363 360/264.2
7,466,519 B2 12/2008 Wakaki et al.
(Continued)

FOREIGN PATENT DOCUMENTS

JP 2004363205 A 12/2004
JP 5752948 A 7/2015
(Continued)

OTHER PUBLICATIONS

Decision to Grant a Patent mailed Apr. 28, 2026 in corresponding Japanese Patent Application No. 2022-196595 with English machine translation, 3 pages.

*Primary Examiner* — Steven T Sawyer
(74) *Attorney, Agent, or Firm* — Kim & Stewart LLP

(57) ABSTRACT

According to one embodiment, a disk device includes a first FPC and second FPCs. The first FPC includes a first insulating layer, a second insulating layer covering the first insulating layer, and a first conductive layer between the first insulating layer and the second insulating layer. The first conductive layer is provided with first terminals. The second insulating layer is provided with holes through which the first terminals are exposed. The second FPC includes a first face facing the second insulating layer, a second face opposite the first face, and second terminals on the first face. The second terminals are joined to the first terminals with a conductive bonding material. At least one second face includes a first area being lower in lightness than a part of the first FPC, the part where the first conductive layer is covered by the second insulating layer.

12 Claims, 7 Drawing Sheets

(51) Int. Cl.
*H05K 1/189* (2026.01)
*G11B 5/48* (2006.01)

(58) Field of Classification Search
CPC .... H05K 1/189; G11B 5/4846; G11B 5/4806; G11B 5/6005
See application file for complete search history.

(56) References Cited

U.S. PATENT DOCUMENTS

| | | | | |
|---|---|---|---|---|
| 8,835,767 | B2 | 9/2014 | Ishigaki | |
| 11,074,931 | B1 | 7/2021 | Aoki | |
| 11,205,448 | B2 | 12/2021 | Sato | |
| 2004/0246626 | A1* | 12/2004 | Wakaki | G11B 5/486 |
| 2020/0154577 | A1* | 5/2020 | Momose | B23K 3/08 |
| 2021/0090595 | A1* | 3/2021 | Sato | H05K 1/116 |
| 2022/0076697 | A1 | 3/2022 | Sato | |

FOREIGN PATENT DOCUMENTS

| | | | |
|---|---|---|---|
| JP | 2021-048272 | A | 3/2021 |
| JP | 2021-140850 | A | 9/2021 |

* cited by examiner 16
31
19
43, 43A
43, 43B
43, 43C
43, 43D
43, 43E
43, 43F
52
52b
53
Lpc
81
55
111, 115
115
112, 116
LL
44
62
AH
65
61, 61a
X
Y
Z 16, 43, 43A, 52
94b
52a
19
91a
93
52b
94a
85
72, 81
104
105
S
92
55, 103
91
91b
107
61, 61a
82
83
94
71a
74
71
71b
75
73, 88
101
76
31
Y
Z
X 16
43, 43A
31
52
53
43, 43G
111, 115
52
202
43, 43C
43, 43D
52
52b
43, 43H
43, 43F
52
111, 115
202
52
19
81
55
111, 115
112, 116
201
115
65
44
202
62
61, 61a
X
Y
Z 16
43, 43I
52
53
31
43, 43J
52
111, 115
43, 43K
43, 43L
52
52b
43, 43M
43, 43N
19
81
55
111, 115
65
44
62
61, 61a
X
Y
Z

DISK DEVICE

CROSS-REFERENCE TO RELATED APPLICATIONS

This application is based upon and claims the benefit of priority from Japanese Patent Application No. 2022-196595, filed on Dec. 8, 2022, the entire contents of which are incorporated herein by reference.

FIELD

Embodiments described herein relate generally to a disk device.

BACKGROUND

Disk devices such as a hard disk drive (HDD) include magnetic disks and magnetic heads that read and write information from and to the magnetic disks. For example, a plurality of flexible printed circuit boards (FPC) electrically connect the magnetic heads and a control device that controls the HDD. Two FPCs are connected to each other by joining a terminal of one of the FPCs and a terminal of the other with solder.

To join the terminals of the two FPCs with solder, the solder is heated with, for example, laser light. Excessive laser heating of the periphery of the terminals may cause the FPCs to be scorched or scraped. Insufficient heating of the FPCs may however result in insufficiently melted solder not enough to join the terminals together.

DETAILED DESCRIPTION

In general, according to one embodiment, a disk device includes a first flexible printed circuit board and a plurality of second flexible printed circuit boards. The first flexible printed circuit board includes a first insulating layer, a second insulating layer covering the first insulating layer, and a first conductive layer between the first insulating layer and the second insulating layer. The first conductive layer is provided with a plurality of first terminals. The second insulating layer is provided with a plurality of holes through which the plurality of first terminals is exposed. Each of the plurality of second flexible printed circuit boards has a magnetic head mounted thereon. Each of the plurality of second flexible printed circuit boards includes a first face facing the second insulating layer, a second face being opposite the first face, and a plurality of second terminals provided on the first face. The plurality of second terminals are joined to the plurality of first terminals, respectively, with a conductive bonding material. The second face of at least one of the plurality of second flexible printed circuit boards includes a first area being lower in lightness than a part of the first flexible printed circuit board, the part where the first conductive layer is covered by the second insulating layer.

First Embodiment

Hereinafter, a first embodiment will be described with reference to FIGS. 1 to 5. In the present specification, components according to embodiments and descriptions of the components may be described in a plurality of expressions. The components and the descriptions thereof are examples, and are not limited by the expressions of the present specification. The components may be identified by names different from the names in the present specification. The components may be described by expressions different from the expressions in the present specification.

Figure 1:
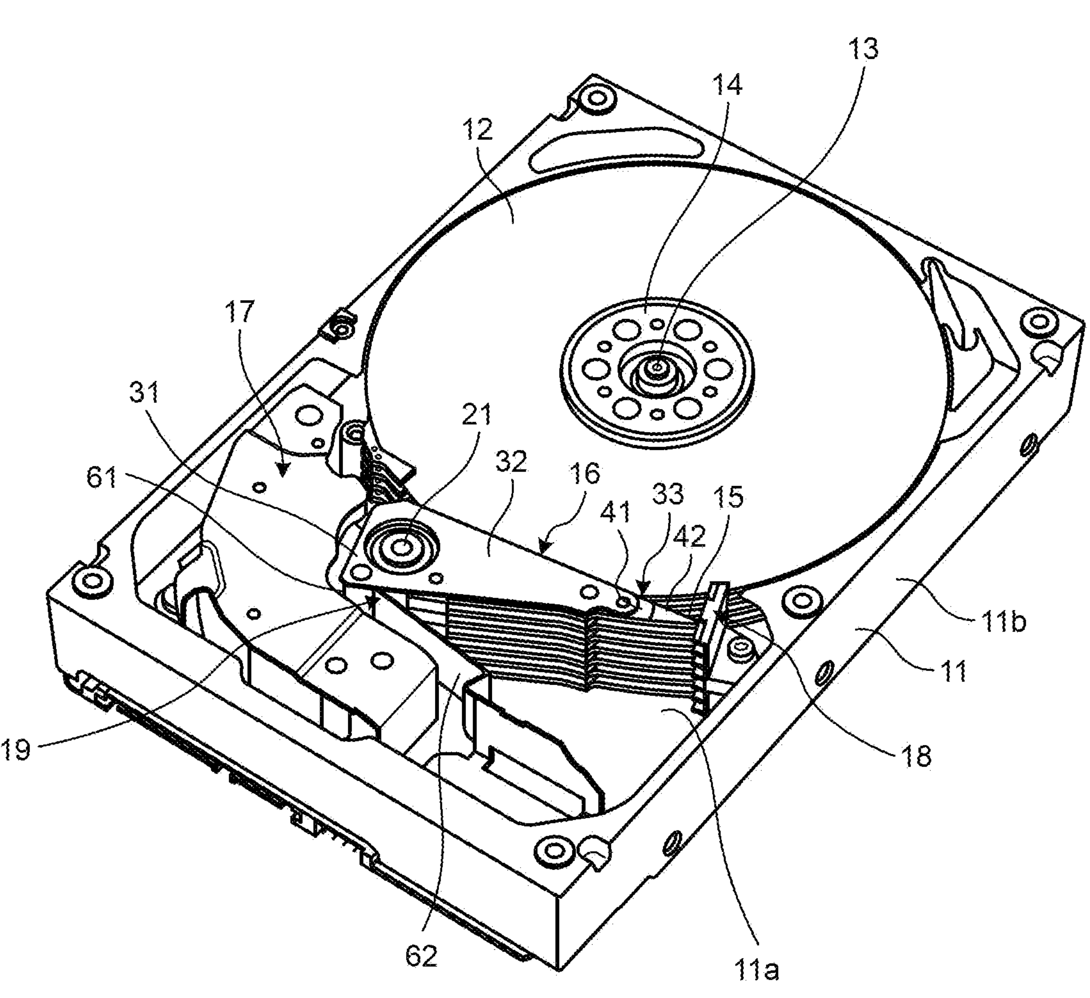
FIG. 1 is an exemplary perspective view illustrating an HDD according to a first embodiment.
Figure 1:

FIG. 1 is an exemplary perspective view schematically illustrating a hard disk drive (HDD) 1 according to the first embodiment. The HDD 1 is an example of a disk device. The disk device is not limited to the HDD 1 and may be another disk device such as a hybrid hard disk drive.

As illustrated in FIG. 1, the HDD 1 includes a housing 11, a plurality of magnetic disks 12, a spindle motor 13, a clamp spring 14, a plurality of magnetic heads 15, a head stack assembly (HSA) 16, a voice coil motor (VCM) 17, a ramp load mechanism 18, and a flexible printed circuit board (FPC) 19. The FPC 19 is an example of a first flexible printed circuit board.

The housing 11 includes a bottom wall 11*a* of a plate-like shape and a side wall 11*b* protruding from an outer edge of the bottom wall 11*a*. The housing 11 further includes a cover attached to the side wall 11*b* to cover the inside of the housing 11. At least some of the magnetic disks 12, the spindle motor 13, the clamp spring 14, the magnetic heads 15, the HSA 16, the VCM 17, the ramp load mechanism 18, and the FPC 19 are accommodated in the housing 11.

The magnetic disk 12 is, for example, a disk including a magnetic recording layer provided on at least one of an upper surface and a lower surface. The diameter of the magnetic disk 12 is, for example, 3.5 inches, but the diameter is not limited to this example.

The spindle motor 13 supports and rotates the plurality of magnetic disks 12 stacked at intervals. The clamp spring 14 holds the plurality of magnetic disks 12 on a hub of the spindle motor 13.

The magnetic heads 15 record and reproduce information on and from the recording layers of the magnetic disks 12. In other words, the magnetic heads 15 read and write information from and to the magnetic disks 12. The magnetic heads 15 are mounted on the HSA 16.

The HSA 16 is rotatably supported by a support shaft 21 disposed at a position separated from the magnetic disks 12. The VCM 17 rotates the HSA 16 to be disposed at a desired position. When the magnetic head 15 moves to the outermost periphery of the magnetic disks 12 by the rotation of the HSA 16 by the VCM 17, the ramp load mechanism 18 holds the magnetic head 15 at an unload position separated from the magnetic disks 12.

A printed circuit board (PCB) is attached to the outside of the bottom wall 11*a* of the housing 11. A control device that controls the spindle motor 13, the magnetic heads 15, and the VCM 17 is mounted on the PCB.

The control device includes various electronic components such as a read/write channel (RWC), a hard disk controller (HDC), a processor, a RAM, a ROM, a buffer memory, and a servo combo IC. The control device is electrically connected to the magnetic heads 15 and the VCM 17 via the FPC 19.

The HSA 16 has an actuator block 31, a plurality of arms 32, and a plurality of head gimbal assemblies (HGA) 33. The HGA 33 may also be referred to as a suspension.

The actuator block 31 is rotatably supported by the support shaft 21 via a bearing, for example. The plurality of arms 32 protrude from the actuator block 31 in a direction substantially orthogonal to the support shaft 21. The HSA 16 may be divided, and the plurality of arms 32 may protrude from a plurality of actuator blocks 31, respectively.

The plurality of arms 32 are disposed at intervals in the direction in which the support shaft 21 extends. Each of the arms 32 has a plate-like shape capable of entering a gap between adjacent magnetic disks 12. The plurality of arms 32 extend substantially in parallel.

A voice coil of the VCM 17 is provided on a protrusion protruding from the actuator block 31. The VCM 17 includes a pair of yokes, a voice coil disposed between the yokes, and a magnet provided on the yokes.

The HGA 33 is attached to a distal end of its corresponding arm 32 and protrudes from the arm 32. This causes the plurality of HGA 33 to be disposed at intervals in the direction in which the support shaft 21 extends.

Figure 2:
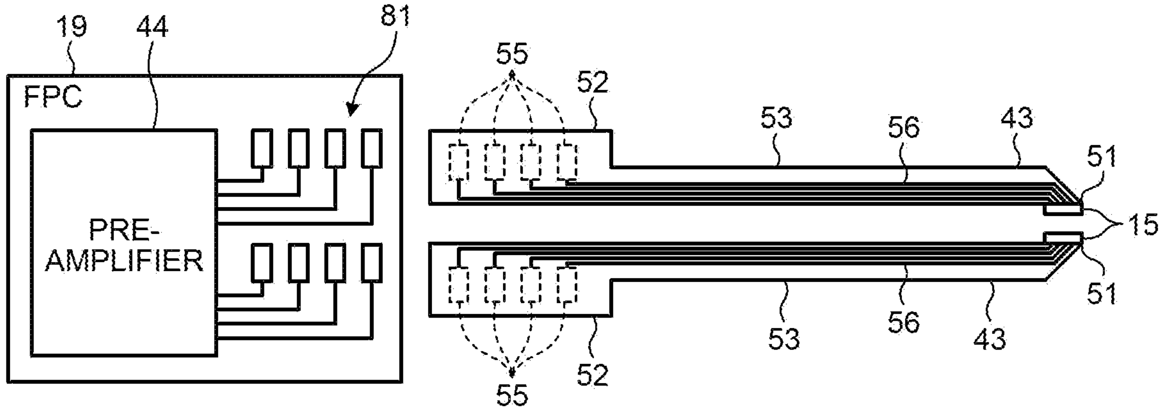
FIG. 2 is an exemplary diagram schematically illustrating an FPC and a flexure of the first embodiment.

FIG. 2 is an exemplary diagram schematically illustrating the FPC 19 and a flexure 43 of the first embodiment. Each of the plurality of HGA 33 includes a base plate 41 and a load beam 42 illustrated in FIG. 1, and the flexure 43 and a preamplifier 44 illustrated in FIG. 2. That is, the HDD 1 includes a plurality of flexures 43. Further, the magnetic head 15 is mounted on the HGA 33. The flexure 43 is an example of a second flexible printed circuit board and may also be referred to as a relay FPC. The preamplifier 44 may also be referred to as a head IC or a head amplifier.

The base plate 41 in FIG. 1 is attached to the distal end of the arm 32. The load beam 42 has a plate-like shape thinner than the base plate 41. The load beam 42 is attached to a distal end of the base plate 41 and protrudes from the base plate 41.

As illustrated in FIG. 2, the flexure 43 has an elongated band shape. The shape of the flexure 43 is not limited to this example. The flexure 43 is a multilayer substrate having flexibility. The flexure 43 includes a gimbal 51, a tail 52, and an intermediate part 53. The tail 52 is an example of a band.

The gimbal 51 is provided at one end of the flexure 43. The tail 52 is provided at the other end of the flexure 43. The intermediate part 53 extends between the gimbal 51 and the tail 52.

The magnetic head 15 is mounted on the gimbal 51. The gimbal 51 is attached to the load beam 42 so as to be displaceable above the load beam 42. The gimbal 51 is displaced in accordance with the displacement of the magnetic head 15 and is displaced in accordance with the drive of a piezoelectric device, for example.

The intermediate part 53 extends from the gimbal 51 and projects outside the base plate 41 and the load beam 42. The intermediate part 53 extends along the arm 32 toward the actuator block 31.

The tail 52 has a substantially rectangular shape extending in a longitudinal direction of the intermediate part 53. The tail 52 includes a plurality of pads 55. The pad 55 is an example of a second terminal. The pads 55 are arranged at intervals in a longitudinal direction of the tail 52 to form flying leads.

The flexure 43 further includes a plurality of wires 56. The wires 56 extend through the intermediate part 53 between the gimbal 51 and the tail 52. Each of the plurality of wires 56 electrically connects at least one of the plurality of pads 55 to a read device, a write device, a heater, or another component of the magnetic head 15. In other words, the wire 56 extends between the pad 55 and the electrode connected to the magnetic head 15 and forms at least a part of an electrical path between the pad 55 and the magnetic head 15.

Figure 3:
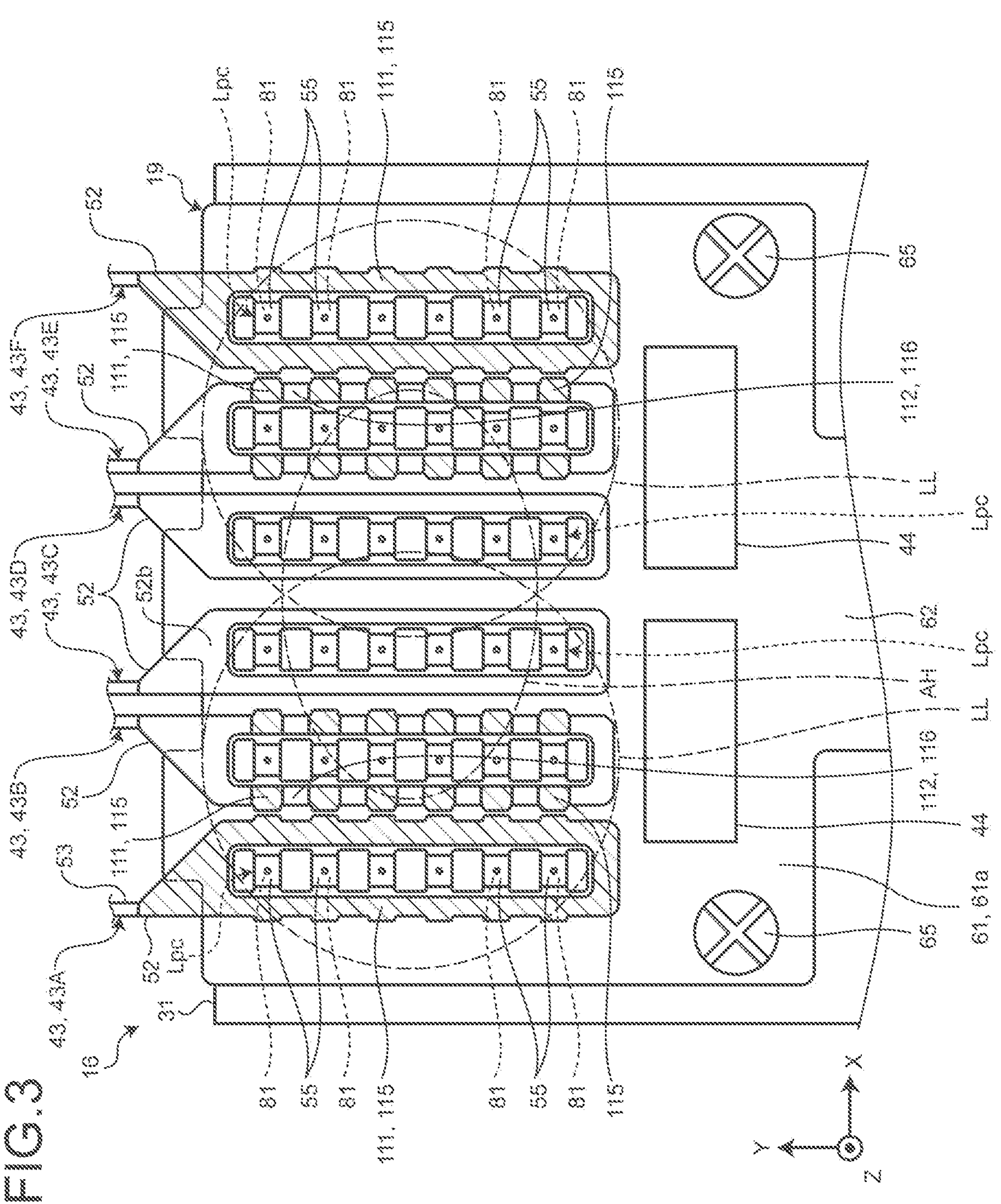
FIG. 3 is an exemplary plan view schematically illustrating a part of the FPC and a part of the flexure of the first embodiment.

FIG. 3 is an exemplary plan view schematically illustrating a part of the FPC 19 and a part of the flexure 43 of the first embodiment. As illustrated in FIG. 3, the FPC 19 includes a joint 61 and an extending part 62.

The joint 61 is provided at one end of the FPC 19. The joint 61 is attached to the actuator block 31 by, for example, a plurality of screws 65. The other end of the FPC 19 is electrically connected to the PCB on which the above-described control device is mounted through a connector provided on the bottom wall 11*a*, for example. The extending part 62 extends between the joint 61 and the connector. As illustrated in FIG. 1, a part of the extending part 62 is bent in a substantially arc shape. The extending part 62 can absorb the displacement of the joint 61 accompanying the rotation of the HSA 16 by bending.

As illustrated in FIG. 3, the tails 52 of the plurality of flexures 43 are attached to the joint 61 of the FPC 19. The FPC 19 electrically connects the PCB on which the above-described control device is mounted and the flexure 43. That is, the control device is electrically connected to the magnetic heads 15 via the PCB, the FPC 19, and the flexures 43.

Figure 4:
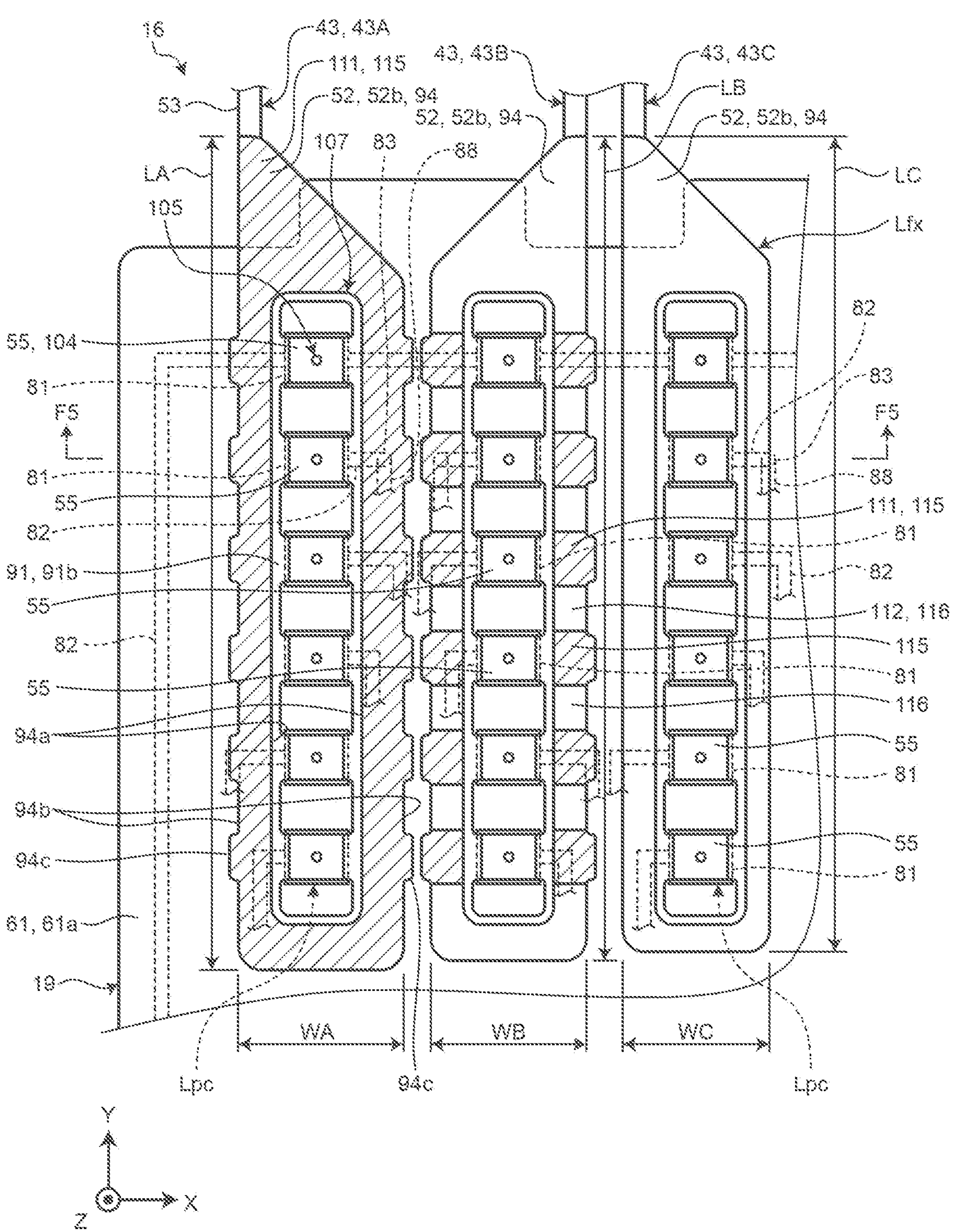
FIG. 4 is an exemplary plan view schematically illustrating a tail and a joint of the first embodiment.
Figure 5:
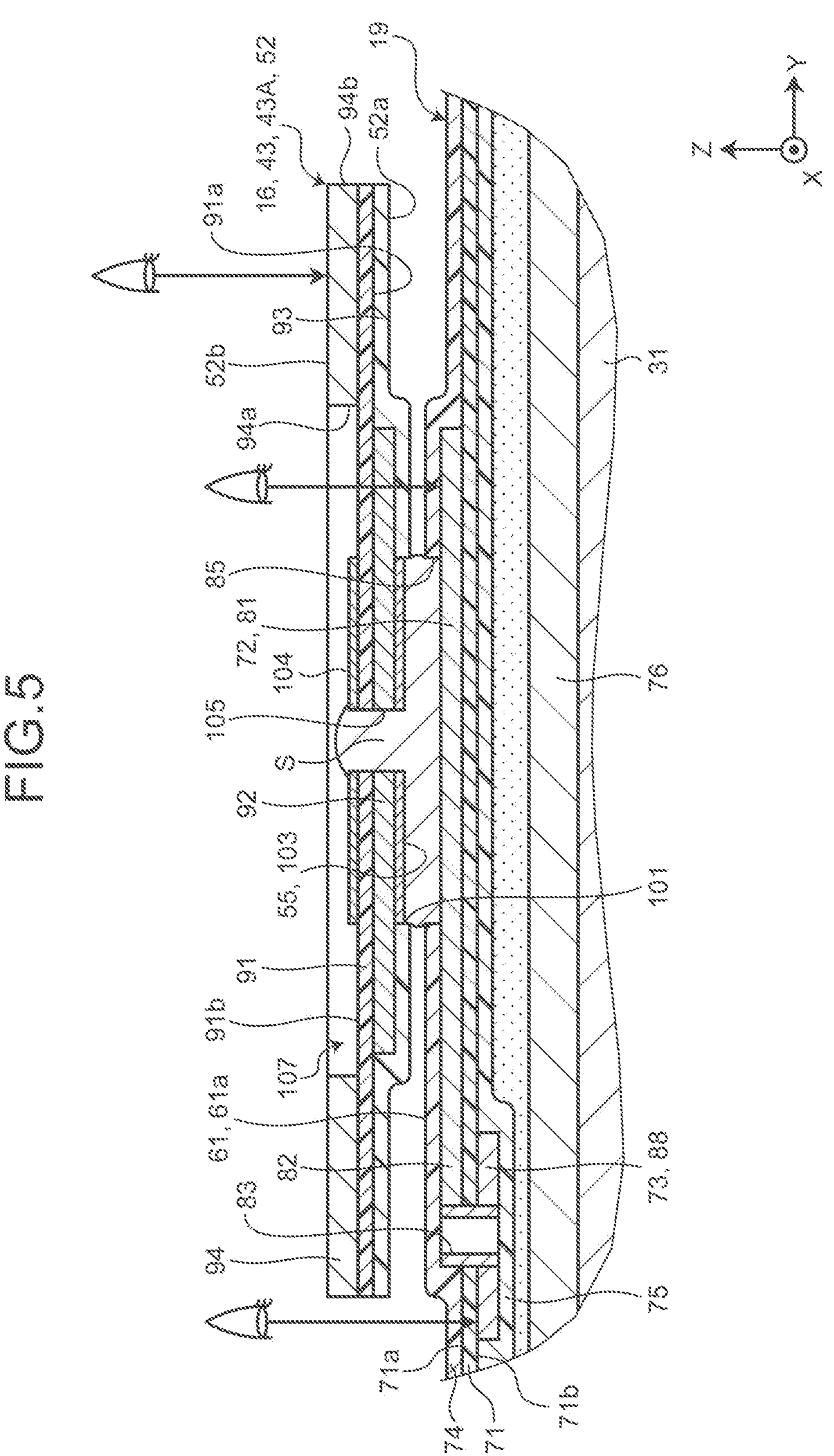
FIG. 5 is an exemplary sectional view schematically illustrating the tail and the joint portion of the first embodiment along the line F5-F5 in FIG. 4.

FIG. 4 is an exemplary plan view schematically illustrating the tail 52 and the joint 61 of the first embodiment. FIG. 5 is an exemplary sectional view schematically illustrating the tail 52 and the joint 61 of the first embodiment along the line F5-F5 in FIG. 4.

As illustrated in FIG. 5, the FPC 19 includes, for example, a base layer 71, two conductive layers 72 and 73, two cover layers 74 and 75, and a metal plate 76. In addition, the FPC 19 includes an adhesive layer between two or more layers. The FPC 19 is not limited to this example and may have fewer layers or more layers.

The base layer 71 is an example of a first insulating layer. The conductive layer 72 is an example of a first conductive layer. The conductive layer 73 is an example of a second conductive layer. The cover layer 74 is an example of a second insulating layer.

The base layer 71 and the cover layers 74 and 75 are, for example, flexible and insulating films, and are made of a synthetic resin such as polyimide or polyester. The base layer 71 includes two opposing faces 71*a* and 71*b*. The face 71*b* faces the actuator block 31.

The conductive layers 72 and 73 are made of, for example, a conductive metal such as copper. The conductive layer 72 is stacked on the face 71*a* of the base layer 71. The conductive layer 73 is stacked on the face 71*b* of the base layer 71. Thus, the base layer 71 lies between the two conductive layers 72 and 73.

The cover layer 74 is stacked on the face 71*a* of the base layer 71 and the conductive layer 72. That is, the cover layer 74 covers at least a part of the face 71*a* of the base layer 71 and at least a part of the conductive layer 72. The conductive layer 72 lies between the base layer 71 and the cover layer 74.

The cover layer 75 is stacked on the face 71*b* of the base layer 71 and the conductive layer 73. That is, the cover layer 75 covers at least a part of the face 71*b* of the base layer 71 and at least a part of the conductive layer 73. Thus, the base layer 71 lies between the two cover layers 74 and 75.

The metal plate 76 is made of, for example, stainless steel. The metal plate 76 is attached to the cover layer 75 of the joint 61. Thus, the joint 61 is substantially flat. The metal plate 76 is attached to the actuator block 31.

The joint 61 of the FPC 19 includes an outer face 61*a*. The outer face 61*a* is one surface of the joint 61, and is formed of, for example, the cover layer 74 and a part of the conductive layer 72 and the base layer 71 exposed by a hole of the cover layer 74. The outer face 61*a* may be formed of another portion.

As illustrated in FIG. 5, the outer face 61*a* may microscopically have irregularities. However, the outer face 61*a* is formed to be substantially flat macroscopically. As illustrated in the plurality of drawings including FIG. 3, assuming that the outer face 61*a* is flat, an X axis, a Y axis, and a Z axis are defined herein for convenience. The X axis, the Y axis, and the Z axis are orthogonal to each other. The X axis is provided along the width of the outer face 61*a*. The Y axis is provided along the length of the outer face 61*a*. The Z axis is provided orthogonal to the outer face 61*a*.

Further, in the present specification, an X direction, a Y direction, and a Z direction are defined. The X direction is a direction along the X axis and includes a +X direction indicated by an arrow of the X axis and a −X direction which is an opposite direction of the arrow of the X axis. The Y direction is a direction along the Y axis and includes a +Y direction indicated by an arrow of the Y axis and a −Y direction which is an opposite direction of the arrow of the Y axis. The Z direction is a direction along the Z axis and includes a +Z direction indicated by an arrow of the Z axis and a −Z direction which is an opposite direction of the arrow of the Z axis.

The X direction and the Y direction are directions along the outer face 61*a*. The X direction and the Y direction are orthogonal to each other. The Z direction is a direction orthogonal to the outer face 61*a*. The X direction is an example of a second direction. The Y direction is an example of a first direction.

The joint 61 may be bent such that the outer face 61*a* has a curved surface shape or such that the outer face 61*a* has unevenness macroscopically as well. In this case, the X direction is a width direction of the joint 61 along the outer face 61*a*, and the Y direction is a length direction of the joint 61 along the outer face 61*a*.

As illustrated in FIG. 4, in the joint 61, the conductive layer 72 includes a plurality of pads 81, a plurality of wires 82, and a plurality of vias 83. In other words, the pads 81 are provided on the conductive layer 72. The pad 81 is an example of a first terminal.

The pads 81 are provided on the outer face 61*a*. Specifically, as illustrated in FIG. 5, each of the plurality of pads 81 is exposed to outside the FPC 19 through a hole 85 in the cover layer 74. Thereby, the pads 81 are provided on the outer face 61*a*.

As illustrated in FIG. 3, the plurality of pads 81 are arranged in six rows in the Y direction. In other words, the plurality of pads 81 form six columns Lpc. In the example of FIG. 3, each of the columns Lpc includes six pads arranged in the Y direction among the plurality of pads 81. The number of the columns Lpc of the pads 81 and the number of the plurality of pads 81 included in each column Lpc are not limited to this example.

In each column Lpc, the plurality of pads 81 are arranged at intervals in the Y direction. The plurality of columns Lpc of the pad 81 are arranged at intervals in the X direction. The number of pads 81 in each column Lpc corresponds to, for example, the function of the magnetic heads 15.

As illustrated in FIG. 4, each of the plurality of wires 82 extends from corresponding one of the plurality of pads 81. In the present embodiment, at least one of the plurality of wires 82 connects the corresponding pad 81 and the preamplifier 44. At least another one of the plurality of wires 82 connects the corresponding pad 81 and the corresponding via 83.

The conductive layer 73 includes a plurality of wires 88. The conductive layer 73 may have another part such as a ground plane. In the present embodiment, the wires 88 connects the via 83 and the preamplifier 44.

The tails 52 of the plurality of flexures 43 are mounted on the plurality of columns Lpc of the pads 81. Each tail 52 of the plurality of flexures 43 extends in the Y direction and covers the plurality of pads 81 of the corresponding column Lpc. Thus, the tails 52 of the plurality of flexures 43 are arranged in a row Lfx at intervals in the X direction. The row Lfx includes six tails 52 arranged in the X direction.

As illustrated in FIG. 5, the plurality of pads 55 on the tail 52 is joined to the corresponding pads 81 of the corresponding columns Lpc with solder S, respectively. In other words, the pads 55 are soldered to the corresponding pads 81. The solder S has conductivity and is an example of a bonding material. The solder S is leaded solder or lead-free solder. The bonding material is not limited to the solder S, and may be, for example, a silver paste, wax, or a conductive adhesive.

Each of the plurality of flexures 43 includes a base layer 91, a conductive layer 92, a cover layer 93, and a metal plate 94. The metal plate 94 may also be referred to as a backing plate or a backing layer. An adhesive layer is interposed between the plurality of layers of the flexure 43. The flexure 43 is not limited to this example and may have fewer layers or more layers.

The base layer 91 and the cover layer 93 are, for example, flexible and insulating films, and are made of a synthetic resin such as polyimide or polyester. The base layer 91 includes two opposing faces 91*a* and 91*b*. The face 91*a* faces the outer face 61*a* of the joint 61.

The conductive layer 92 is made of, for example, a conductive metal such as copper. The conductive layer 92 is stacked on the face 91*a* of the base layer 91. The cover layer 93 is stacked on the face 91*a* of the base layer 91 and the conductive layer 92. That is, the cover layer 93 covers at least a part of the face 91*a* of the base layer 91 and at least a part of the conductive layer 92.

The metal plate 94 is made of, for example, metal such as stainless steel or aluminum. The metal plate 94 is attached to the face 91*b* of the base layer 91. Thus, the base layer 91 is positioned between the conductive layer 92 and the metal plate 94.

The tail 52 includes two outer faces 52*a* and 52*b* opposite to each other. The outer face 52*a* is an example of a first surface. The outer face 52*b* is an example of a second surface. The outer face 52*a* is one surface of the tail 52, and is formed of, for example, the cover layer 93 and the conductive layer 92 and the base layer 91 exposed by a hole of the cover layer 93. The outer face 52*b* is the other surface of the tail 52, and is formed of, for example, the metal plate 94 and the base layer 91 exposed by a hole of the metal plate 94. The outer faces 52*a* and 52*b* may be formed of other portions.

As illustrated in FIG. 5, the outer faces 52*a* and 52*b* may microscopically have irregularities. However, the outer faces 52*a* and 52*b* are formed to be substantially flat macroscopically and are disposed along the X-Y plane. Thus, the X direction and the Y direction are directions along the outer faces 52*a* and 52*b*.

The outer faces 52*a* and 52*b* of the tail 52 are substantially parallel to the outer face 61*a* of the joint 61. However, the outer faces 52*a* and 52*b* of the tail 52 and the outer face 61*a* of the joint 61 does not have to be parallel. In this case, a direction along the outer faces 52*a* and 52*b* of the tail 52 is an example of the first direction and the second direction.

The outer face 52*a* faces the outer face 61*a* of the joint 61. In other words, the outer face 52*a* faces the cover layer 74. The outer face 52*a* is separated from the cover layer 74 in the +Z direction. The outer face 52*a* may be in contact with the cover layer 74.

The plurality of pads 55 are provided on the conductive layer 92. In other words, the conductive layer 92 includes the plurality of pads 55. Each of the plurality of pads 55 is exposed to outside the flexure 43 through a hole 101 in the cover layer 93. In this manner the pads 55 are provided on the outer face 52*a*.

Each of the plurality of pads 55 includes plating 103. Further, the face 91*b* of the base layer 91 is coated with a plurality of pieces of plating 104 corresponding to the plurality of pads 55. In other words, the pieces of the plating 104 are provided on the face 91*b*. The plating 103 and 104 are made of, for example, gold.

The FPC 19 is provided with a through hole 105. The through hole 105 penetrates the base layer 91, the pad 55, and the plating 104. The solder S for joining the pad 55 and the pad 81 also passes through the through hole 105 and adheres to the plating 104.

The metal plate 94 is provided with a slit 107. The slit 107 penetrates the metal plate 94 in the Z direction and extends substantially in the Y direction. The slit 107 exposes the plurality of pieces of plating 104 and a part of the base layer 91 around the pieces of plating 104 to the outside of the tail 52.

In this manner, the outer face 52*b* of the tail 52 of the present embodiment is formed by the portion exposed by the slit 107 in the face 91*b* of the base layer 91, the metal plate 94, and the plating 104. In other words, the exposed portion by the slit 107 in the face 91*b* of the base layer 91, the metal plate 94, and the plating 104 each include a part of the outer face 52*b*. The outer face 52*b* is not limited to this example.

As illustrated in FIG. 3, the plurality of flexures 43 may be individually referred to as flexures 43A, 43B, 43C, 43D, 43E, and 43F. Among the plurality of flexures 43, the flexures 43A and 43F are located at the ends of the row Lfx. The flexures 43B, 43C, 43D, and 43E are located between the flexures 43A and 43F. The flexures 43C and 43D are located between the flexures 43B and 43E.

The flexures 43A and 43F are mirror symmetric with respect to each other. The flexures 43B and 43E are mirror symmetric with respect to each other. Further, the flexures 43C and 43D are mirror symmetric with respect to each other. Thus, in the following, the flexures 43A, 43B, and 43C will be mainly described.

As illustrated in FIG. 4, in the X direction a width WA of the tail 52 the flexure 43A is larger than a width WB of the tail 52 of the flexure 43B. The width WB is larger than a width WC of the tail 52 of the flexure 43C in the X direction. That is, among the plurality of flexures 43 the flexure 43A has a larger width in the X direction than the flexures 43B and 43C located closer to the center of the row Lfx than to the end of the row Lfx. In this manner, at least two of the plurality of flexures 43 have the tails 52 of different widths in the X direction.

Further, in the Y direction a length LA of the tail 52 of the flexure 43A is longer than a length LB of the tail 52 of the flexure 43B. The length LB is longer than a length LC of the tail 52 of the flexure 43C in the Y direction. In this manner, at least two of the plurality of flexures 43 have the tails 52 of different lengths in the Y direction.

The outer faces 52*b* of the tails 52 of the flexures 43A, 43B, 43E, and 43F each include a first are (a dark-color part) 111. Hatching in FIGS. 3 and 4 indicates not a cross section but the first area 111 for convenience.

The outer faces 52*b* of the tails 52 of the flexures 43B, 43C, 43D, and 43E each further include a second are (a light-color part) 112. Thus, the tails 52 of the flexures 43B and 43E include both the first areas 111 and the second areas 112.

In the present embodiment, a part of the outer face 52*b* on the metal plate 94 includes at least one of the first area 111 and the second area 112. The first area 111 and the second area 112 are not limited to this example, and may be provided, for example, in a portion exposed by the slit 107 in the face 91*b* of the base layer 91.

In the present embodiment, the first area 111 is, for example, a colored part of the metal plate 94. The second area 112 is, for example, an uncolored part of the metal plate 94. The second area 112 is higher in lightness than the first area 111.

The first area 111 is, for example, a film (plating) of nickel or another metal formed on the surface of the metal plate 94 by electroless plating. The first area 111 is not limited to this example. For example, the first area 111 may be a paint applied to the surface of the metal plate 94, an oxide film formed on the surface of the metal plate 94 by laser marking, or an oxide film formed on the surface of the metal plate 94 by annealing treatment.

The first area 111 may be a portion formed of a material different from the second area 112 in the metal plate 94. For example, the second area 112 of the metal plate 94 may be made of stainless steel, and the first area 111 may be made of graphite.

The color of the first area 111 is, for example, black. The color of the first area 111 may be another color having lower lightness than the color of the second area 112. The color of the first area 111 is not limited to a single color, and the first area 111 may have a plurality of colors or may have color gradation.

The second area 112 is formed of, for example, the material of the metal plate 94. Thus, the color of the second area 112 is, for example, a metal color of stainless steel or aluminum. The color of the second area 112 is not limited to this example.

In the flexures 43A and 43F, the first area 111 is disposed in the entire outer face 52*b* of the metal plate 94. In the present embodiment, the color of the portion included in the gimbal 51 and the intermediate part 53 of the metal plate 94 of the flexures 43A and 43F is also the same as the color of the first area 111. That is, the entire region of the outer face of the metal plate 94 of the flexures 43A and 43F is the first area 111. The gimbal 51 and the intermediate part 53 do not have to be colored.

The metal plates 94 of the flexures 43C and 43D are not colored. That is, in the flexures 43C and 43D, the second area 112 is disposed on the entire outer face 52*b* of the metal plate 94. Thus, the first area 111 is lower in lightness than the outer face 52*b* of one of the plurality of flexures 43 (the flexure 43C or the flexure 43D).

The flexures 43B and 43E are partially colored. In the flexures 43B and 43E, the first area 111 has a plurality of dark areas (dark-color regions) 115, and the second area 112 has a plurality of light areas (light-color regions) 116.

The plurality of dark areas 115 is aligned with the plurality of pads 55 in the X direction, respectively. In other words, at least part of the dark areas 115 and at least part of the corresponding pads 55 are disposed at the same position in the Y direction. In the present embodiment, the plurality of dark areas 115 are arranged in two rows in the Y direction. Each of the plurality of pads 55 is disposed between two adjacent dark areas 115 in the X direction.

The plurality of dark areas 115 and the plurality of light areas 116 are alternately arranged in the Y direction. Thus, the second area 112 is spaced farther from the plurality of pads 55 than the first area 111. In the Y direction, at least one of the plurality of light areas 116 is located between two adjacent dark areas 115 and between two adjacent pads 55.

The metal plate 94 includes two inner edges 94*a* and two outer edges 94*b*. The two inner edges 94*a* are part of the inner edge of the metal plate 94 forming the slit 107 and extend substantially in the Y direction in a substantially linear manner. The outer edges 94*b* are part of the outer edge of the metal plate 94 and extend substantially in the Y direction in a substantially linear manner. The two inner edges 94*a* are positioned between the two outer edges 94*b*.

The metal plate 94 of the flexures 43A, 43B, 43E, and 43F further includes a plurality of protrusions 94*c*. The plurality of protrusions 94*c* protrude in the X direction from the outer edge 94*b*. The plurality of protrusions 94*c* are disposed apart from each other in the Y direction.

Each of the plurality of protrusions 94*c* is aligned in the X direction with a corresponding one of the plurality of pads 55. Each of the plurality of dark areas 115 is provided between the inner edge 94*a* and the tip of the protrusion 94*c*. In other words, a part of the dark area 115 is provided in the protrusion 94*c*. On the other hand, each of the plurality of light areas 116 is provided between the inner edge 94*a* and the outer edge 94*b*. That is, the first area 111 has a larger width than the second area 112 in the X direction.

The base layer 71 and the cover layers 74 and 75 of the FPC 19 can partially transmit light. Thus, as illustrated in FIG. 5, the conductive layer 72 can be visually recognized through the cover layer 74. Further, the conductive layer 73 can be visibly recognized through the cover layer 74 and the base layer 71.

For example, the color of the conductive layers 72 and 73 becomes darker as seen through a plurality of layers or a thick layer. Thus, when common light illuminates the outer face 61*a* of the joint 61, the lightness of the conductive layer 73 seen through the cover layer 74 and the base layer 71 is lower than the lightness of the conductive layer 72 seen through the cover layer 74. In other words, in the FPC 19, the lightness of the portion where the cover layer 74 and the base layer 71 cover the conductive layer 73 is lower than the lightness of the portion where the cover layer 74 covers the conductive layer 72.

When the outer face 52*b* of the tail 52 and the outer face 61*a* of the joint 61 are irradiated with the same light, each of the plurality of dark areas 115 of the first area 111 is lower in lightness than the conductive layer 72 seen through the cover layer 74. In other words, each of the plurality of dark areas 115 has lower lightness than the part of the FPC 19, the part where the conductive layer 72 is covered by the cover layer 74.

Further, the lightness of each of the plurality of dark areas 115 is lower than the lightness of the conductive layer 73 seen through the cover layer 74 and the base layer 71. In other words, the lightness of each of the plurality of dark areas 115 is lower than the lightness of the portion of the FPC 19 where the cover layer 74 and the base layer 71 cover the conductive layer 73.

In the present embodiment, each of the plurality of dark areas 115 has lower lightness than a portion of the FPC 19 that is visually recognized from the outside of the FPC 19 and has the lowest lightness. The dark area 115 is not limited to this example.

The first area 111 has larger surface roughness than the conductive layer 72 and the conductive layer 73. That is, the surface roughness of at least a part of the outer face 52*b* in at least one of the plurality of flexures 43 is larger than the surface roughness of the conductive layers 72 and 73.

For example, a maximum height Rz of the first area 111 is larger than 0.8 μm. Further, an arithmetic average roughness Ra of the first area 111 is larger than 0.15 μm. The maximum height Rz and the arithmetic average roughness Ra of the first area 111 are not limited to this example.

In the present embodiment, the surface roughness of the first area 111 is larger than the surface roughness of the second area 112. The surface roughness of the first area 111 and the surface roughness of the second area 112 may be the same.

In assembling the HDD 1 described above, the pads 55 of the flexure 43 are joined to the pads 81 of the FPC 19 by the solder S. For example, a paste containing the solder S is applied to one of the pads 55 and 81. Next, the tail 52 of the flexure 43 and the joint 61 of the FPC 19 are overlapped, and the paste is attached to the other of the pads 55 and 81.

Next, for example, the tail 52 and the joint 61 are irradiated with laser light LL illustrated in FIG. 3. The laser light LL in FIG. 3 is an area laser and is applied to a relatively wide range of the tail 52 and the joint 61. The laser light LL is not limited to this example.

The laser light LL is applied to the tail 52 and the joint 61, and is applied to the solder S through the through hole 105. Heat is transferred from the tail 52 and the joint 61 heated by the laser light LL to the solder S. Further, the solder S is directly heated by the laser light LL. As a result, the paste is melted, and the pad 55 and the pad 81 are joined by the solder S.

The outer face 52*b* of the tail 52 and the outer face 61*a* of the joint 61 receive the laser light LL. That is, the first area 111 and the second area 112 of the outer face 52*b* receive the laser light LL and absorb the laser light LL.

A portion having low lightness absorbs light and is more likely to be heated than a portion having high lightness. In other words, a portion having high lightness is more likely to reflect light than a portion having low lightness. Thus, the first area 111 of the outer face 52*b* is heated by the laser light LL to have a higher temperature than the second area 112.

Of the tail 52 and the joint 61 irradiated with the laser light LL, a central part AH is likely to have a higher temperature than the rest. The central part AH includes at least one flexure 43 (for example, the flexures 43B, 43C, 43D, and 43E) close to the center of the row Lfx among the plurality of flexures 43, and includes at least one pad 55 close to the center among the plurality of pads 55 of the flexures 43B, 43C, 43D, and 43E.

The central part AH is less likely to release heat applied by the laser light LL and is likely to have a high temperature. On the other hand, the portion outside the central part AH is likely to release heat and have a low temperature. Thus, in the tail 52 and the joint 61 irradiated with the laser light LL, normally, the central part AH is likely to have a high temperature.

In the present embodiment, the flexures 43C and 43D of the row Lfx have the second area 112 but do not have the first area 111. Thus, the outer face 52*b* of the tail 52 of the flexures 43C and 43D is less likely to absorb the laser light LL and have a higher temperature than the outer face 52*b* of the flexures 43A, 43B, 43E, and 43F.

The flexures 43B and 43E of the row Lfx include the plurality of dark areas 115 of the first area 111 and the plurality of light areas 116 of the second area 112. Each of the plurality of dark areas 115 is adjacent to the corresponding pad 55. Thus, the outer face 52*b* of the tail 52 is likely absorb the laser light LL in the vicinity of the pad 55. However, the outer face 52*b* hardly absorbs the laser light LL at a position separated from the pad 55.

A portion of the tail 52 in the vicinity of the pad 55 is heated to a high temperature by the laser light LL to heat the solder S. This causes the solder S to efficiently melt. On the other hand, the light area 116 separated from the pad 55 has a lower temperature than the dark area 115. Thus, a portion of the tail 52 including the light area 116 is less likely to have a high temperature. That is, even when the tail 52 is irradiated with the laser light LL which is an area laser, a portion in the vicinity of the pad 55 can be selectively heated.

The flexures 43A and 43F of the row Lfx have the first area 111 but do not have the second area 112. Thus, the outer face 52*b* of the tail 52 of the flexures 43A and 43F easily absorbs the laser light LL and is likely to have a high temperature.

The flexures 43C and 43D are smaller in width and shorter in length than the flexures 43A and 43F. In addition, the flexures 43C and 43D do not have the protrusions 94*c*, but the flexures 43A and 43F have the protrusions 94*c*. Thus, the flexures 43A and 43F have a larger area of the outer face 52*b* that can receive the laser light LL than the flexures 43C and 43D.

Further, the surface roughness of the first area 111 is larger than the surface roughness of the second area 112. Thus, the flexures 43A and 43F have a larger surface area of the outer face 52*b* that can receive the laser light LL than the flexures 43C and 43D.

In this manner, the flexures 43C and 43D included in the central part AH are not easily heated, and the flexures 43A and 43F positioned outside the central part AH are easily heated. Thus, the temperature distributions of the tail 52 and the joint 61 irradiated with the laser light LL become more even.

The laser light LL applied to the outer face 61*a* of the joint 61 heats the joint 61. In the same manner as in the flexure 43, a portion having low lightness in the joint 61 absorbs light and is more likely to be heated than a portion having high lightness.

On the outer face 61*a* of the joint 61, the conductive layer 72 is visible through the cover layer 74, and the conductive layer 73 is visible through the cover layer 74 and the base layer 71. Since the conductive layer 72 is visually recognized through the cover layer 74, a portion of the joint 61 where the cover layer 74 covers the conductive layer 72 forms a relatively dark portion of the joint 61. Further, since the conductive layer 73 is visually recognized through the cover layer 74 and the base layer 71, a portion of the joint 61 where the cover layer 74 and the base layer 71 cover the conductive layer 73 forms a darker portion of the joint 61. On the other hand, the portion of the joint 61 where the conductive layers 72 and 73 are not provided forms a portion having a lighter color than the color of the portion where the conductive layers 72 and 73 are provided.

A portion of the joint 61 including the conductive layer 73 is a portion of the joint 61 having the lowest lightness to be irradiated with the laser light LL. On the other hand, a portion of the joint 61 where the conductive layers 72 and 73 are not provided is a portion of the joint 61 having the highest lightness to be irradiated with the laser light LL. The joint 61 is not limited to this example.

Since the portion including the conductive layer 72 in the joint 61 has a relatively dark color, the portion is heated by the laser light LL to have a relatively high temperature. In addition, since the portion including the conductive layer 73 in the joint 61 has a darker color, the temperature of the portion becomes higher.

In another expression, the laser light LL applied to the joint 61 is absorbed and reflected by the conductive layer 72 through the cover layer 74. Further, the laser light LL is absorbed and reflected by the conductive layer 73 through the cover layer 74 and the base layer 71. The laser light LL is absorbed by the cover layer 74 and the base layer 71. Thus, in the joint 61, the portion including the conductive layer 73 is likely to have a higher temperature than the portion including the conductive layer 72.

When common laser light LL is applied to the outer faces 52*b* and 61*a*, the lightness of each of the plurality of dark areas 115 is lower than the lightness of the portion of the joint 61 where the cover layer 74 and the base layer 71 cover the conductive layer 73. Further, the dark area 115 has a surface roughness larger than that of the conductive layer 73 and easily absorbs the laser light LL. Thus, when the tail 52 and the joint 61 are irradiated with the laser light LL, the temperature of the joint 61 becomes lower than the temperature of the dark area 115.

When the FPC 19 is excessively heated, the conductive layers 72 and 73 may be peeled off from the base layer 71, or the outer face 61*a* of the joint 61 may be scorched, for example. However, in the present embodiment, the portion having the lowest lightness in the joint 61 has higher lightness than the dark area 115. Thus, the joint 61 is not easily heated, and occurrence of peeling and scorching can be suppressed.

On the other hand, when the heating of the solder S is insufficient, there is a possibility that the solder S is not sufficiently melted. For example, even when the solder S is sufficiently melted in the central part AH, there is a possibility that the solder S is not sufficiently melted outside the central part AH. However, in the present embodiment, the flexures 43A and 43F positioned outside the central part AH have the dark area 115 and are easily heated. Thus, the solder S applied to the pads 55 of the flexures 43A and 43F can also be more reliably melted.

For example, when the flexure 43 is excessively heated in the central part AH, there is a possibility that the flexure 43 may be peeled and scorched. However, in the present embodiment, the flexures 43C and 43D positioned in the central part AH have the second area 112 and are not easily heated. Thus, the flexures 43C and 43D are not easily heated, and the occurrence of peeling and scorching can be suppressed.

In the HDD 1 according to the first embodiment described above, the FPC 19 includes the conductive layer 72 and the plurality of pads 81. The conductive layer 72 is interposed between the base layer 71 and the cover layer 74. The conductive layer 72 is provided with the plurality of pads 81. The plurality of pads 81 is exposed through the plurality of holes 85 in the cover layer 74. Each of the plurality of flexures 43 includes the outer faces 52*a* and 52*b* and the plurality of pads 55. The outer face 52*a* faces the cover layer 74. The outer face 52*b* is opposite the outer face 52*a*. The plurality of pads 55 is provided on the outer face 52*a* and is joined to the plurality of pads 81 with conductive solder S, respectively. In typical assembly of the HDD 1, a relatively wide area of the outer face 52*b* is irradiated with the laser light LL, for example, to melt the solder S to join the pads 81 and the pads 55 together. The cover layer 74 of the FPC 19 is also exposed to the laser light LL. Such laser irradiation may excessively heat a part of the FPC 19, causing the FPC 19 to be partially burnt and scraped. In another case, a part of the FPC 19 may not be sufficiently heated, resulting in insufficient melting of the solder S and failing in joining the pads 81 and the pads 55 together. In this regard, in the HDD 1 of the present embodiment, the outer face 52*b* of at least one of the plurality of flexures 43 includes the first area 111. The first area 111 is lower in lightness than a part of the FPC 19, the part where the conductive layer 72 is covered by the cover layer 74. In other words, at least a part of the outer face 52*b* is set to lower lightness. With respect to the part irradiated with the laser light LL, the lower the lightness it has, the higher the absorption of the laser light LL it exhibits. Thus, the flexure 43 including the first area 111 can efficiently absorb the laser light LL. As such, the HDD 1 can allow efficient heating of the solder S to join the pads 81 of the FPC 19 and the pads 55 of the flexures 43, thereby shortening the time for melting the solder S with the laser light LL. By shortening the irradiation time of the laser light LL, the HDD 1 can avoid partial overheating of the FPC 19, leading to reducing or preventing occurrence of burns and scrapes in the FPC 19. Further, by setting at least not-easily heatable locations on the outer face 52*b* to lower lightness, the HDD 1 can prevent insufficient melting of the solder S. In this manner, the HDD 1 according to the present embodiment can reduce or prevent a failure in joining the FPC 19 and the flexures 43.

In at least one of the plurality of flexures 43, the outer face 52*b* includes the second area 112 spaced farther from the plurality of pads 55 than the first area 111. The second area 112 is higher in lightness than the first area 111. Thus, the first area 111 is located in the vicinity of the pads 55. Because of this, the HDD 1 of the present embodiment can allow efficient heating of the solder S to join the pads 81 of the FPC 19 and the pads 55 of the flexures 43. Further, the HDD 1 can avoid overheating of the second area 112 contributing less to the melting of the solder S. Consequently, the HDD 1 can reduce or prevent a failure in joining between the FPC 19 and the flexures 43.

Each of the plurality of flexures 43 includes the tail 52 extending in the Y direction along the outer face 52*a*. In the flexure 43B, the tail 52 includes the first area 111 and the second area 112. The first area 111 includes the plurality of dark areas 115. The plurality of dark areas 115 is aligned with the plurality of pads 55, respectively, in the X direction along the outer face 52*a* and orthogonal to the Y direction. The second area 112 includes the plurality of light areas 116. The plurality of dark areas 115 and the plurality of light areas 116 are alternately arranged in the Y direction. Owing to such arrangement, the HDD 1 according to the present embodiment allows efficient heating of the solder S to join the pads 81 of the FPC 19 and the pads 55 of the flexures 43. Further, due to the alternate arrangement of the easily heatable dark areas 115 and the not-easily heatable light areas 116, the HDD 1 can implement uniform temperature distribution of the tails 52. As such, the tails 52 can be avoided from being burnt or scraped due to a local high temperature.

The first area 111 is larger in width than the second area 112 in the X direction along the outer face 52*a* and orthogonal to the Y direction. This allows the first area 111 highly absorptive of the laser light LL to be set in a larger area. Thus, the HDD 1 of the present embodiment can allow efficient heating of the solder S to join the pads 81 of the FPC 19 and the pads 55 of the flexures 43.

At least the flexures 43A and 43C of the plurality of flexures 43 have the tails 52 of different widths WA and WC in the X direction. Typically, as the tail 52 widens, the area of the outer face 52*b* increases. That is, as the tail 52 widens, it becomes more absorptive of the laser light LL. By setting the tail 52 of the not-easily heatable flexure 43A to a larger width among the plurality of flexures 43, the HDD 1 of the present embodiment can implement uniform temperature distribution of the heated FPC 19 and flexures 43. That is, the pieces of solder S can be substantially uniformly and sufficiently heated. Consequently, the HDD 1 can reduce or prevent a failure in joining the FPC 19 and the flexures 43.

The plurality of flexures 43 is arranged in the row Lfx in the X direction. Typically, the flexure 43 located at the end of the row Lfx easily releases heat. In this regard, among the plurality of flexures 43 in the HDD 1 of the present embodiment, the flexure 43A located at the end of the row Lfx has the tail 52 of a larger width in the X direction than the flexure 43C located closer to the center of the row Lfx than to the end. Thus, the HDD 1 of the present embodiment can implement uniform temperature distribution of the heated FPC 19 and flexures 43. As such, the HDD 1 can reduce or prevent a failure in joining the FPC 19 and the flexures 43.

Among the plurality of flexures 43, the tails 52 of at least the flexures 43A and 43C have different lengths in the Y direction. Typically, as the tail 52 elongates, the area of the outer face 52*b* increases. That is, as the tail 52 elongates, it becomes more absorptive of the laser light LL. By setting the tail 52 of the not-easily heatable flexure 43A to a longer length among the plurality of flexures 43, the HDD 1 of the present embodiment can implement uniform temperature distribution of the heated FPC 19 and flexures 43. Consequently, the HDD 1 can reduce or prevent a failure in joining the FPC 19 and the flexures 43.

The first area 111 is lower in lightness than the outer face 52*b* (second area 112) of the flexure 43C among the plurality of flexures 43. That is, among the plurality of flexures 43, the flexure 43C includes no first area 111, so that the outer face 52*b* can be set to relatively high lightness as a whole. Thereby, the HDD 1 of the present embodiment can prevent overheating of the flexures 43.

Each of the plurality of flexures 43 includes the metal plate 94 including at least a part of the outer face 52*b*. The metal plate 94 is provided with the first area 111. This can facilitate forming of the first area 111 by, for example, plating or forming an oxide film.

In the flexure 43A, the first area 111 is provided on the entire outer face 52*b* of the metal plate 94. This can facilitate forming of the first area 111 by collectively coloring at least one surface of the metal plate 94 by, for example, plating or forming an oxide film.

The FPC 19 includes the conductive layer 73. The base layer 71 is interposed between the conductive layer 72 and the conductive layer 73. The first area 111 has lower lightness than the part of the FPC 19, the part where the conductive layer 73 is covered by the base layer 71 and the cover layer 74. The part of the FPC 19 where the conductive layer 73 is seen through the two insulating layers (the base layer 71 and the cover layer 74) is lower in lightness than another part of the FPC 19 where the conductive layer 72 is seen through the one cover layer 74. That is, in the flexure 43 the first area 111 is set to lower lightness. Thus, the HDD 1 can allow more efficient heating of the solder S to join the pads 81 of the FPC 19 and the pads 55 of the flexures 43. The present embodiment has described an example that the part of the FPC 19 where the two insulating layers (the base layer 71 and the cover layer 74) cover the conductive layer 73 has lower lightness than another part where the cover layer 74 covers the conductive layer 72, however, the base layer 71 may have lower optical absorptivity than the cover layer 74.

At least a part of the flexure 43, such as the first area 111, has larger surface roughness than the conductive layer 72. In general, the larger the surface roughness is, the larger the surface area absorbing the laser light LL is and the higher the absorption of the laser light LL is. Thus, the HDD 1 of the present embodiment can allow efficient heating of the solder S to join the pads 81 of the FPC 19 and the pads 55 of the flexures 43.

In the first embodiment described above, the outer faces of the metal plates 94 of the flexures 43A and 43F are entirely colored, the outer faces of the metal plates 94 of the flexures 43B and 43E are partially colored, and the outer faces of the metal plates 94 of the flexures 43C and 43D are not colored. However, the outer faces of the metal plates 94 of all the flexures 43 may be entirely colored, or the outer faces of the metal plates 94 of all the flexures 43 may be partially colored.

In the first embodiment described above, the surface roughness of the first area 111 is larger than the surface roughness of the conductive layers 72 and 73. However, a portion having a large surface roughness of the outer face 52*b* of the tail 52 may be different from the first area 111.

Second Embodiment

Hereinafter, a second embodiment will be described with reference to FIG. 6. In the following description of the plurality of embodiments, components having the same functions as those of the components already described are denoted by the same reference numerals as those of the components already described, and the description thereof may be omitted. The plurality of components denoted by the same reference numerals do not necessarily have all the functions and properties in common, and may have different functions and properties according to each embodiment.

Figure 6:
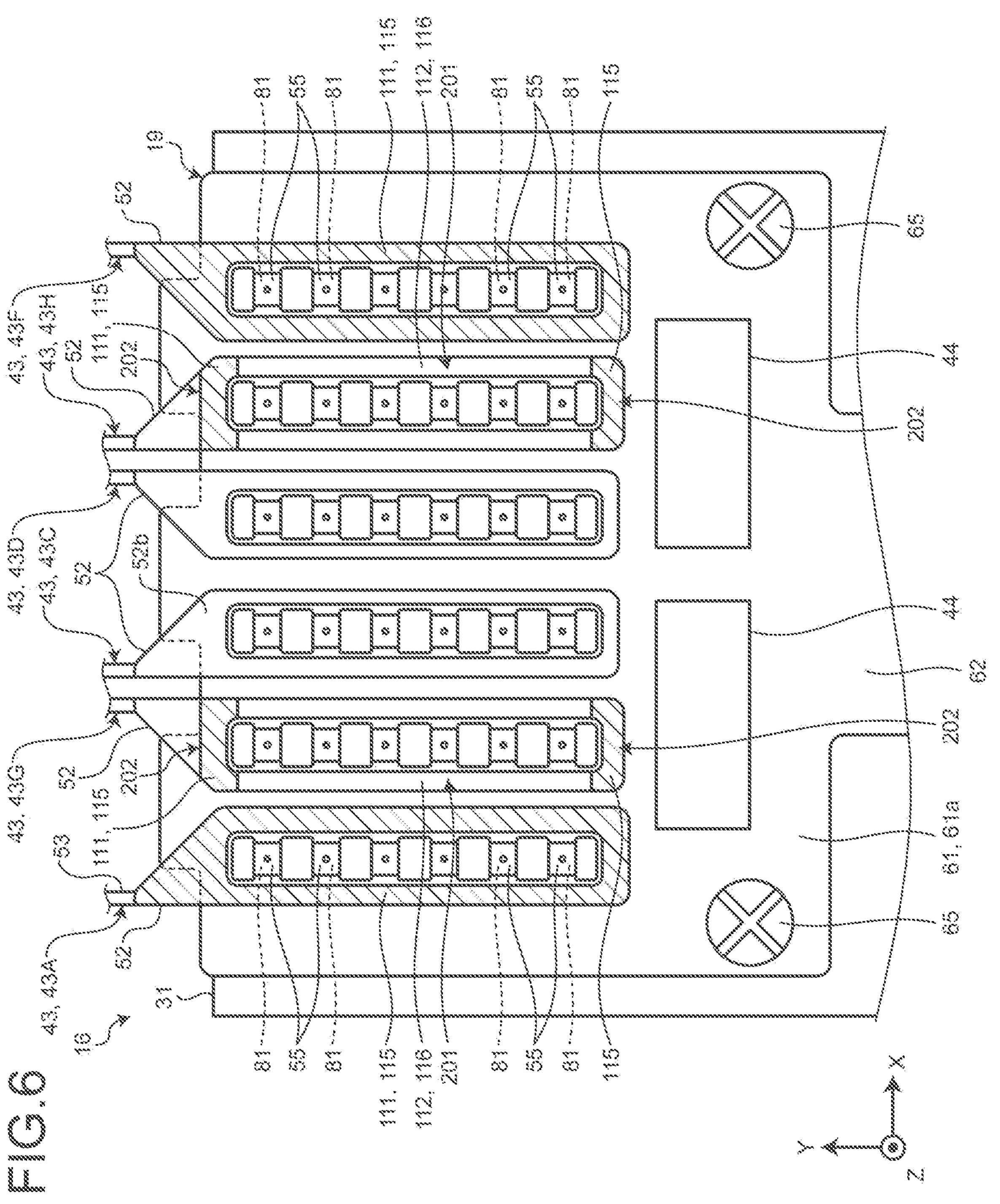
FIG. 6 is an exemplary plan view schematically illustrating a part of an FPC and a part of a flexure according to a second embodiment.

FIG. 6 is an exemplary plan view schematically illustrating a part of the FPC 19 and a part of the flexure 43 according to the second embodiment. As illustrated in FIG. 6, the plurality of flexures 43 of the second embodiment include flexures 43G and 43H instead of the flexures 43B and 43E. The flexures 43G and 43H are substantially equal to the flexures 43B and 43E except for the points described below.

Each of the tails 52 of the flexures 43G and 43H includes an intermediate part 201 and two distal ends 202. The intermediate part 201 is an example of a first part. The distal end 202 is an example of a second part.

The intermediate parts 201 are part of the tails 52 of the flexures 43G and 43H, the part including the plurality of pads 55. In the tails 52 of the flexures 43G and 43H, the two distal ends 202 are located outside the intermediate parts 201 apart from the plurality of pads 55. The two distal ends 202 are at both ends of the tail 52 in the Y direction. Thus, the intermediate part 201 extends between the two distal ends 202 in the Y direction.

The distal end 202 includes the dark area 115 of the first area 111. The distal end 202 may further include the second area 112. On the other hand, the intermediate part 201 includes no first area 111 but includes the light area 116 of the second area 112. Thus, in the intermediate part 201 the outer face 52*b* of the tail 52 has higher lightness than the first area 111.

When the flexures 43G and 43H are irradiated with the laser light LL, the temperature of the distal end 202 becomes higher than that of the intermediate part 201. The heat of the distal end 202 is transferred to the intermediate part 201 by heat conduction. That is, the intermediate part 201 is heated by heat conduction from the distal end 202 rather than by direct heat from the laser light LL. Thus, the intermediate part 201 is less likely to have a higher temperature than the distal end 202.

Among the plurality of pads 55, a pad 55 positioned in the vicinity of the distal end 202 is positioned outside the central part AH. For this reason, in general, the pad 55 positioned in the vicinity of the distal end 202 is not easily heated. However, the heat of the distal end 202 preferentially transfers to the pad 55 positioned in the vicinity of the distal end 202. Thus, the pad 55 positioned outside the central part AH can also be sufficiently heated.

In the HDD 1 of the second embodiment described above, among the plurality of flexures 43 the flexures 43G and 43H each include the intermediate part 201 and the distal ends 202. The intermediate part 201 includes the plurality of pads 55. The distal ends 202 are located outside the intermediate part 201 apart from the plurality of pads 55. The distal end 202 includes the first area 111. In the intermediate part 201 the outer face 52*b* is higher in lightness than the first area 111. That is, the outer face 52*b* has higher lightness in the vicinity of the plurality of pads 55 than in the locations (distal ends 202) apart from the plurality of pads 55. Thus, the HDD 1 of the present embodiment can prevent overheating of the flexures 43 in the vicinity of the pads 55. Typically, the solder S is more likely to be insufficiently melted at farther locations from the center of the plurality of pads 55. In the HDD 1 of the present embodiment, however, the distal ends 202 far from the center of the plurality of pads 55 includes the first areas 111, so that insufficient melting of the solder S can be avoided efficiently. In this manner, the HDD 1 according to the present embodiment can reduce or prevent a failure in joining the FPC 19 and the flexures 43.

Third Embodiment

Figure 7:
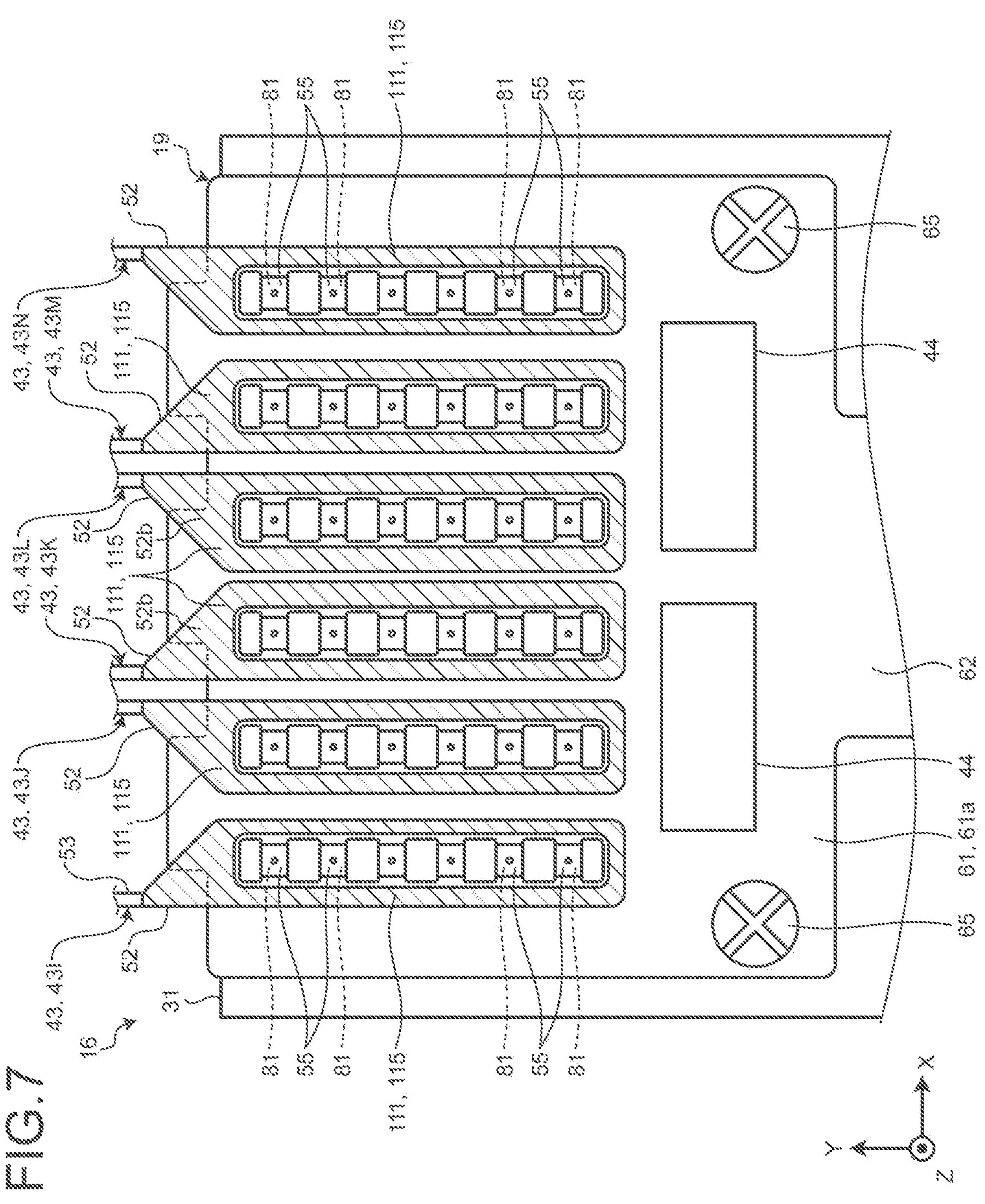
FIG. 7 is an exemplary plan view schematically illustrating a part of an FPC and a part of a flexure according to a third embodiment.

Hereinafter, a third embodiment will be described with reference to FIG. 7. FIG. 7 is an exemplary plan view schematically illustrating a part of the FPC 19 and a part of the flexure 43 according to the third embodiment. As illustrated in FIG. 7, the plurality of flexures 43 of the third embodiment include flexures 43I, 43J, 43K, 43L, 43M, and 43N instead of the flexures 43A, 43B, 43C, 43D, 43E, and 43F. The flexures 43I, 43J, 43K, 43L, 43M, and 43N are substantially equal to the flexures 43A, 43B, 43C, 43D, 43E, and 43F, except for the points described below.

The outer face 52*b* of the tail 52 of the flexures 43I, 43J, 43K, 43L, 43M, and 43N includes the first area 111 but does not have the second area 112. The flexures 43I, 43J, 43K, 43L, 43M, and 43N are not limited to this example, and may have the second area 112.

In the X direction the tail 52 of the flexure 43I has a smaller width than the tail 52 of the flexure 43J. The tail 52 of the flexure 43J has a smaller width than the tail 52 of the flexure 43K in the X direction. That is, among the plurality of flexures 43 the flexure 43I has a smaller width in the X direction than the flexure 43K closer to the center of the row Lfx than to the end of the row Lfx.

For example, there is a case where the central part AH is likely to have a lower temperature than the rest due to various conditions such as disposition of other components. In the present embodiment, the flexure 43K included in the central part AH has a larger area of the outer face 52*b* capable of receiving the laser light LL than the flexure 43I. Thus, the temperature distributions of the tail 52 and the joint 61 irradiated with the laser light LL become more even.

In the HDD 1 of the third embodiment described above, the flexures 43 are arranged in the row Lfx in the X direction. In the HDD 1 of the present embodiment, among the plurality of flexures 43 the flexure 43I located at the end of the row Lfx has the tail 52 of a smaller width in the X direction than the flexure 43K located closer to the center of the row Lfx than to the end of the row Lfx. For example, in some occasion the flexure 43I located at the end of the row Lfx may be easily heatable due to various factors. In such a case the HDD 1 of the present embodiment can implement uniform temperature distribution of the heated FPC 19 and flexures 43. Consequently, the HDD 1 can reduce or prevent a failure in joining between the FPC 19 and the flexures 43.

The number of flexures 43 in the above embodiment is defined as six for convenience of description. However, the HDD 1 may include ten or more magnetic disks 12 and 20 or more flexures 43.

In the above description, "suppress" is defined as, for example, preventing the occurrence of an event, an action, or an influence, or reducing the degree of the event, the action, or the influence. Further, in the above description, "restrict" is defined as, for example, preventing movement or rotation, or allowing movement or rotation within a predetermined range and preventing movement or rotation beyond the predetermined range.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A disk device comprising:
a first flexible printed circuit board including
a first insulating layer,
a second insulating layer covering the first insulating layer,
a first conductive layer between the first insulating layer and the second insulating layer, the first conductive layer being provided with a plurality of first terminals, the second insulating layer being provided with a plurality of holes through which the plurality of first terminals is exposed; and
a plurality of second flexible printed circuit boards each of which has a magnetic head mounted thereon and includes:
a first face facing the second insulating layer,
a second face being opposite the first face, and
a plurality of second terminals provided on the first face and joined to the plurality of first terminals, respectively, with a conductive bonding material,
wherein
the second face of at least one of the plurality of second flexible printed circuit boards includes a first area being lower in lightness than a part of the first flexible printed circuit board, the part where the first conductive layer is covered by the second insulating layer,
the second face of at least one of the plurality of second flexible printed circuit boards includes a second area spaced farther from the plurality of second terminals than the first area,
the second area is higher in lightness than the first area,
each of the plurality of second flexible printed circuit boards includes a band extending in a first direction along the first face,
the band includes the first area and the second area,
the first area includes a plurality of dark areas,
the plurality of dark areas is aligned with the plurality of second terminals, respectively, in a second direction along the first face and orthogonal to the first direction,
the second area includes a plurality of light areas, and
the plurality of dark areas and the plurality of light areas are alternately arranged in the first direction.

2. The disk device according to claim 1, wherein
each of the plurality of second flexible printed circuit boards includes a band extending in a first direction along the first face,
the band includes the first area and the second area, and
in a second direction along the first face and orthogonal to the first direction, the first area has a larger width than the second area.

3. The disk device according to claim 1, wherein
at least one of the plurality of second flexible printed circuit boards includes:
a first part including the plurality of second terminals, and
a second part located outside the first part apart from the plurality of second terminals,
the second part includes the first area, and
in the first part, the second face is higher in lightness than the first area.

4. A disk device comprising:
a first flexible printed circuit board including
a first insulating layer,
a second insulating layer covering the first insulating layer,
a first conductive layer between the first insulating layer and the second insulating layer, the first conductive layer being provided with a plurality of first terminals, the second insulating layer being provided with a plurality of holes through which the plurality of first terminals is exposed; and
a plurality of second flexible printed circuit boards each of which has a magnetic head mounted thereon and includes:
a first face facing the second insulating layer,
a second face being opposite the first face, and
a plurality of second terminals provided on the first face and joined to the plurality of first terminals, respectively, with a conductive bonding material,
wherein
the second face of at least one of the plurality of second flexible printed circuit boards includes a first area being lower in lightness than a part of the first flexible printed circuit board, the part where the first conductive layer is covered by the second insulating layer, each of the plurality of second flexible printed circuit boards includes a band extending in a first direction along the first face, and at least two of the plurality of second flexible printed circuit boards include the bands of different widths in a second direction along the first face and orthogonal to the first direction.

5. The disk device according to claim 4, wherein the plurality of second flexible printed circuit boards are arranged in a row in the second direction, and among the plurality of second flexible printed circuit boards, a first one located at an end of the row includes the band of a larger width in the second direction than a second one located closer to a center of the row than to the end.

6. The disk device according to claim 4, wherein the plurality of second flexible printed circuit boards are arranged in a row in the second direction, and among the plurality of second flexible printed circuit boards, a first one located at an end of the row includes the band of a smaller width in the second direction than a second one located closer to a center of the row than to the end.

7. The disk device according to claim 1, wherein each of the plurality of second flexible printed circuit boards includes a band extending in a first direction along the first face, and at least two of the plurality of second flexible printed circuit boards include the bands of different lengths in the first direction.

8. The disk device according to claim 1, wherein the first area is lower in lightness than the second face of one of the plurality of second flexible printed circuit boards.

9. The disk device according to claim 1, wherein each of the plurality of second flexible printed circuit boards includes a metal plate including at least a part of the second face, and the metal plate is provided with the first area.

10. The disk device according to claim 9, wherein the first area is provided on the entire second face of the metal plate.

11. A disk device comprising:

a first flexible printed circuit board including a first insulating layer, a second insulating layer covering the first insulating layer, a first conductive layer between the first insulating layer and the second insulating layer, the first conductive layer being provided with a plurality of first terminals, the second insulating layer being provided with a plurality of holes through which the plurality of first terminals is exposed; and a plurality of second flexible printed circuit boards each of which has a magnetic head mounted thereon and includes:

a first face facing the second insulating layer, a second face being opposite the first face, and a plurality of second terminals provided on the first face and joined to the plurality of first terminals, respectively, with a conductive bonding material wherein the second face of at least one of the plurality of second flexible printed circuit boards includes a first area being lower in lightness than a part of the first flexible printed circuit board, the part where the first conductive layer is covered by the second insulating layer, the first flexible printed circuit board includes a second conductive layer, the first insulating layer is interposed between the first conductive layer and the second conductive layer, and the first area is lower in lightness than a part of the first flexible printed circuit board, the part where the second conductive layer is covered by the first insulating layer and the second insulating layer.

12. The disk device according to claim 1, wherein the first area is larger in surface roughness than the first conductive layer.

* * * * *